United States Patent
Kim et al.

(10) Patent No.: US 11,475,182 B1
(45) Date of Patent: Oct. 18, 2022

(54) SIMULATION-BASED MAP VALIDATION

(71) Applicants: Doyop Kim, Fremont, CA (US); Christopher Knouss, Danville, CA (US); Bing Mei, Pleasanton, CA (US)

(72) Inventors: Doyop Kim, Fremont, CA (US); Christopher Knouss, Danville, CA (US); Bing Mei, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 695 days.

(21) Appl. No.: 16/394,222

(22) Filed: Apr. 25, 2019

Related U.S. Application Data

(60) Provisional application No. 62/666,861, filed on May 4, 2018.

(51) Int. Cl.
  *G06F 30/20* (2020.01)
  *G01C 21/20* (2006.01)
  *G06N 20/00* (2019.01)

(52) U.S. Cl.
  CPC ............. *G06F 30/20* (2020.01); *G01C 21/20* (2013.01); *G06N 20/00* (2019.01)

(58) Field of Classification Search
  CPC .......... G06F 30/20; G06N 20/00; G01C 21/20
  See application file for complete search history.

(56) References Cited

U.S. PATENT DOCUMENTS

| | | | |
|---|---|---|---|
| 9,645,577 B1 * | 5/2017 | Frazzoli | ............ B60W 30/0956 |
| 2008/0065325 A1 | 3/2008 | Geelen et al. | |
| 2008/0082225 A1 | 4/2008 | Barrett | |
| 2008/0195638 A1 | 8/2008 | Winberry et al. | |
| 2010/0207751 A1 * | 8/2010 | Follmer | ................. G01C 21/32 340/439 |
| 2011/0112762 A1 | 5/2011 | Gruijters et al. | |
| 2013/0326407 A1 | 12/2013 | van Os et al. | |
| 2019/0025841 A1 * | 1/2019 | Haynes | .............. G01C 21/3492 |

OTHER PUBLICATIONS

Zofka MR, Kuhnt F, Kohlhaas R, Rist C, Schamm T, Zöllner JM. Data-driven simulation and parametrization of traffic scenarios for the development of advanced driver assistance systems. In2015 18th International Conference on Information Fusion (Fusion) Jul. 6, 2015 (pp. 1422-1428). IEEE. (Year: 2015).*

(Continued)

*Primary Examiner* — Chuen-Meei Gan
(74) *Attorney, Agent, or Firm* — Young Basile Hanlon & MacFarlane, P.C.

(57) ABSTRACT

A method includes defining a simulated transportation network based on a map that represents a real-world physical transportation network. The simulated transportation network includes segments, and each segment includes information that describes operating characteristics for the segment. The method also includes defining simulated users and performing a simulation in which the simulated users are moved relative to the simulated transportation network. The simulated users are moved using control instructions, and the simulated users are moved based on the information that describes operating characteristics for the segment that corresponds to a respective current location for each of the simulated users. The method also includes identifying map errors based on the simulation.

21 Claims, 4 Drawing Sheets

(56) References Cited

OTHER PUBLICATIONS

Jo K, Lee M, Kim J, Sunwoo M. Tracking and behavior reasoning of moving vehicles based on roadway geometry constraints. IEEE transactions on intelligent transportation systems. Sep. 23, 2016;18(2):460-76. (Year: 2016).*

Hasberg C, Hensel S, Stiller C. Simultaneous localization and mapping for path-constrained motion. IEEE Transactions on Intelligent Transportation Systems. Dec. 27, 2011;13(2):541-52. (Year: 2011).*

* cited by examiner

SIMULATION-BASED MAP VALIDATION

CROSS-REFERENCE TO RELATED APPLICATIONS

This application claims the benefit of U.S. Provisional Application No. 62/666,861, filed on May 4, 2018, the content of which is incorporated herein by reference for all purposes.

TECHNICAL FIELD

The application relates generally to the field of validating digital maps.

BACKGROUND

Digital maps store mapping information in a computer-interpretable format and can include and display features similar to those associated with traditional paper maps, such as geographical features, topographical features, political boundaries, attractions, and transportation networks. Transportation network features that can be displayed on maps include roadways, transit routes, walking paths, and biking paths. In addition, maps can be annotated with various types of information, such as locations and descriptions of businesses. The information stored in digital maps can be utilized by automated systems, such as by automated navigation systems and automated vehicle control systems.

SUMMARY

One aspect of the disclosed embodiments is a method that includes defining a simulated transportation network based on a map that represents a real-world physical transportation network, wherein the simulated transportation network includes segments, and each segment includes information that describes operating characteristics for the segment. The method also includes defining simulated users and performing a simulation in which the simulated users are moved relative to the simulated transportation network. The simulated users are moved using control instructions, and the simulated users are moved based on the information that describes operating characteristics for the segment that corresponds to a respective current location for each of the simulated users. The method also includes identifying map errors based on the simulation.

In some implementations, each of the simulated users is modeled as a particle. The control instructions may include control rules. The control instructions may include a trained machine learning model. In some implementations, at least some of the simulated users are moved using a vehicle dynamics model.

In some implementations, the method includes evaluating a validation rule based on the simulation, and outputting information describing a result based on evaluation of the validation rule. The information describing a result based on evaluation of the validation rule may include a modification to be made to the map. The modification may be automatically applied to the map. Evaluating the validation rule may include determining whether an operating characteristic for one of the simulated users is outside of an acceptable range. Evaluating the validation rule may include determining whether a condition has been satisfied more than a threshold number of times. Evaluating the validation rule may include determining whether one of the simulated users has left the simulated transportation network. Evaluating the validation rule may include determining that a collision has occurred between two of the simulated users.

In some implementations, the method includes outputting, for display, a visualization that is based on the simulation. The method may also include evaluating a validation rule based on the simulation, wherein the visualization includes a graphical indicator that represents a map error indicated by the validation rule.

Another aspect of the disclosed embodiments is a non-transitory computer-readable storage device including program instructions executable by one or more processors that, when executed, cause the one or more processors to perform operations. The operations include defining a simulated transportation network based on a map that represents a real-world physical transportation network. The simulated transportation network includes segments, and each segment includes information that describes operating characteristics for the segment. The operations also include defining simulated users and performing a simulation in which the simulated users are moved relative to the simulated transportation network. The simulated users are moved using control instructions, and the simulated users are moved based on the information that describes operating characteristics for the segment that corresponds to a respective current location for each of the simulated users. The operations also include identifying map errors based on the simulation.

In some implementations of the non-transitory computer-readable storage device, the operations include evaluating a validation rule based on the simulation and outputting information describing a result based on evaluation of the validation rule.

In some implementations of the non-transitory computer-readable storage device, each of the simulated users is modeled as a particle, at least some of the simulated users are moved using a vehicle dynamics model, the operations further comprise evaluating a validation rule based on the simulation, and outputting information describing a result based on evaluation of the validation rule, the information describing a result based on evaluation of the validation rule includes a modification to be made to the map, the modification is automatically applied to the map, the operations further comprise outputting, for display, a visualization that is based on the simulation, and the visualization includes a graphical indicator that represents a map error indicated by the validation rule.

Another aspect of the disclosed embodiments is a system that includes a memory and a processor configured to execute instructions stored in the memory to define a simulated transportation network based on a map that represents a real-world physical transportation network. The simulated transportation network includes segments, and each segment includes information that describes operating characteristics for the segment. The processor is further configured to execute instructions stored in the memory to define simulated users and perform a simulation in which the simulated users are moved relative to the simulated transportation network. The simulated users are moved using control instructions, and the simulated users are moved based on the information that describes operating characteristics for the segment that corresponds to a respective current location for each of the simulated users. The processor is further configured to identify map errors based on the simulation.

In some implementations of the system, the processor is further configured to evaluate a validation rule based on the simulation and output information describing a result based on evaluation of the validation rule.

In some implementations of the system each of the simulated users is modeled as a particle, at least some of the simulated users are moved using a vehicle dynamics model, the processor is configured to execute further instructions stored in the memory to evaluate a validation rule based on the simulation, and output information describing a result based on evaluation of the validation rule, the information describing a result based on evaluation of the validation rule includes a modification to be made to the map, the modification is automatically applied to the map, the processor is configured to execute further instructions stored in the memory to output, for display, a visualization that is based on the simulation, and the visualization includes a graphical indicator that represents a map error indicated by the validation rule.

DETAILED DESCRIPTION

The disclosure herein is directed to systems and methods that validate information contained in digital maps that are used by persons and/or by automated systems. The data that is included in the map represents a physical transportation network. As used herein, the term "transportation network," refers to physical infrastructure that facilitates movement of people and goods between origins and destinations by motorized or non-motorized means, such as roads, trails, sidewalks, crosswalks, and dedicated bicycle lanes.

Validating information in a digital map means that the information contained in the map is analyzed to confirm that it is usable for functions such as navigation, route planning, trajectory planning, and autonomous vehicle control systems, and is intended to identify errors that may reduce the usefulness of the digital map or render it unusable for its intended purpose under certain circumstances. Validation is performed by traversal of a simulated transportation network that is based on the data that is included in the map. The simulated transportation network is traversed by simulated users, which may include simulated motorized vehicles, simulated non-motorized vehicles (e.g., bicycles), and simulated pedestrians. The simulated users may be represented by particles.

The results of the simulation can be output in a form that allows map errors to be identified and corrected. As examples, the results of the simulation can be output as a visualization, as reports that indicate actual errors or potential errors in the map data, and/or modifications that can be applied to the map in response to errors in the map data. Generally stated, map errors represent failures of the map data to accurately represent real-world features and conditions. A map error can be, as an example, map information that represents a geometric feature that does not accurately represent a real-world geometric feature.

Figure 1:
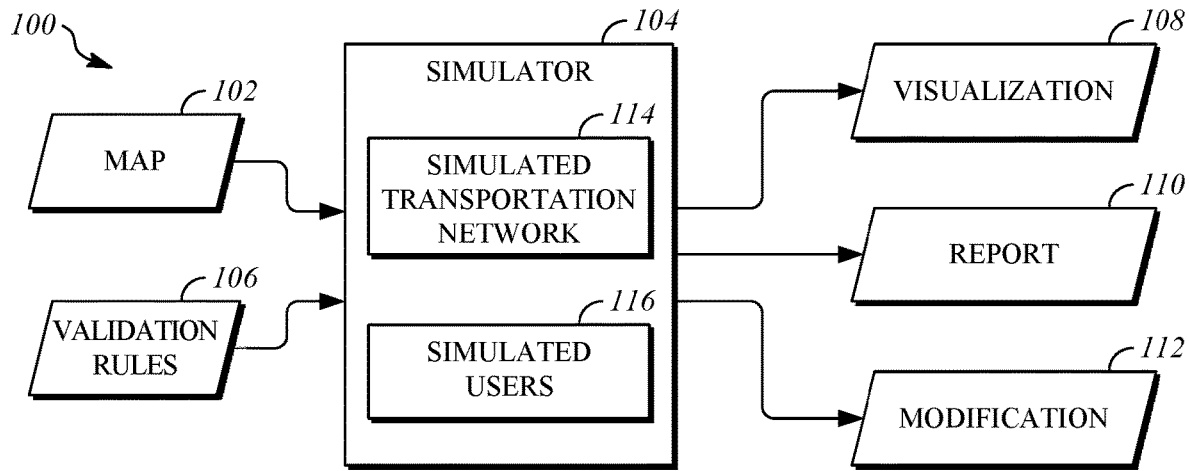
FIG. 1 is a block diagram that shows operation of a system for validating map data that includes a simulator.

FIG. 1 is a block diagram that shows operation of a system 100 for validating map data. The system 100 include a map 102 that is provided as an input to a simulator 104. The simulator 104 may also receive validation rules 106 as an input. As outputs, the simulator 104 may produce a visualization 108, a report 110, and/or a modification 112.

The map 102 may be a high definition digital map that represents real-world physical roadway geometry at an accuracy of one meter or less. The map 102 can include representations of portions of a roadway, such as vehicle lanes, and can also include representations of facilities used by bicycles and pedestrians, such as sidewalks, crosswalks, and dedicated bicycle lanes. The map 102 can also include information (i.e., metadata) that describes physical, functional, and regulatory characteristics that are associated with portions of the map 102, such as directionality of roadway lanes, restrictions on use of facilities (e.g., weight restrictions or occupancy restrictions), and right of way controls (e.g., traffic signals or stop signs).

Figure 2:
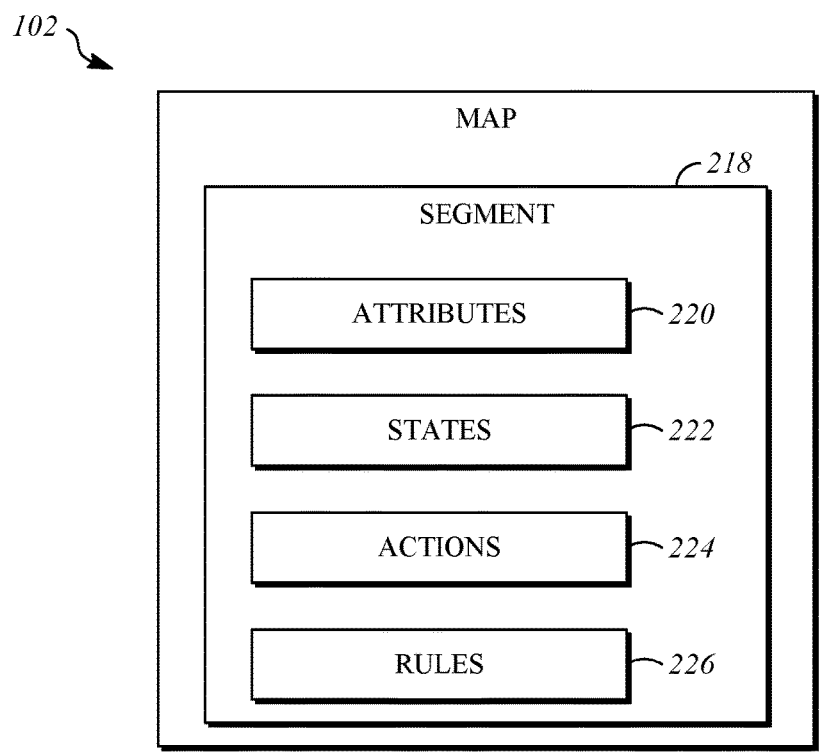
FIG. 2 is a block diagram that shows an example of a data structure for a map.

FIG. 2 is a block diagram that shows an example of a data structure for the map 102. The map 102 is a collection of data elements that represent a real-world physical transportation network, including segments 218. The segments 218 each correspond to a geometric feature of the transportation network.

In some implementations, the segments 218 can be organized hierarchically. As an example, a roadway segment can be defined that contains a group of segments that represent vehicle lanes, bicycle lanes, sidewalks, and/or crosswalks. As opposed to representing a portion of a lane, some of the segments 218 may represent connections between lanes, such as a turning movement through an intersection. Hierarchical organization is optional, and need not be utilized.

The segments 218 are each defined by information that describes physical and functional characteristics of a portion of the transportation network. In the illustrated example, the segments 218 each include attributes 220, states 222, actions 224, and rules 226. The attributes 220, states 222, actions 224, and rules 226 may be in the form of information, such as parameters and corresponding values, that are encoded for the segments 218 on a segment-by-segment basis. The attributes 220, states 222, actions 224, and rules 226 can be encoded as part of the map 102, as shown in the illustrated example, or in a data structure that associated with but separate from the map 102.

The attributes 220 can include information describing, for each of the segments 218, geometry, legal regulations, physical connectivity with other segments, and legal connectivity with other segments. Geometry for each of the segments 218 can be described using, as examples, lines, polylines, curves, and polygons, and may include geometric descriptions of lateral (i.e. left and right) edges of each of the segments 218.

The states 222 are dynamic objects that are associated with the segments 218 and impact the behavior of the simulated users 116. The states 222 have values that can be ascertained by the simulated users 116 during traversal of the simulated transportation network 114. As an example, the states 222 may include a value that corresponds to a current indication displayed by a traffic signal (e.g., is a currently displayed signal indication red, yellow, or green) in the simulated transportation network. As another example, the states 222 may include values that indicate traffic volumes present on the segments 218. As another example, the states 222 may include information that indicates the presence of construction work on the segments 218. As another example, the states 222 may include information that describes the presence of temporary traffic control measures on the segments, such as traffic control by a person (e.g., a construction worker or a police officer). As another example, the states 222 may include values that indicate the presence of a blocked condition within one or more of the segments 218, such as presence of a disabled vehicle.

The actions 224 are associated with the segments 218, and are directives that specify what actions are permitted, required, or prohibited for the simulated users 116 of the simulated transportation network 114 during traversal of a respective one of the segments 218. As examples, the actions 224 may specify, for one of the segments 218, that the simulated users 116 must stop, must yield, must keep clear (i.e., not stop in the segment), may turn, may not turn, may change lanes, or may not change lanes.

The rules 226 are associated with the segments 218, and specify constraints for the simulated users. The rules 226 may be based on laws and/or regulations, and may applicable to all of the segments 218 of the map 102 and can be encoded at the map level or with respect to a grouping of segments, or may be applicable to particular ones of the segments 218 of the map 102 and encoded on a per segment basis.

The simulator 104 is operable to define a simulated transportation network 114 that is based on the map 102. The simulator 104 is further operable to populate the simulated transportation network 114 with simulated users 116. The simulator 104 is operable to execute a simulation that represents use of the physical transportation network that is represented by the map 102. In addition, the simulation may be configured to demonstrate whether an automated vehicle control system is able to traverse the simulated transportation network 114 between an origin and a destination.

During a simulation that is executed by the simulator 104, the simulated users 116 traverse the simulated transportation network 114, and information is collected by the simulator 104. The information collected by the simulator 104 describes events, operating parameters, and other characteristics of the simulated transportation network 114 and the simulated users 116 during the simulation. The information may be in the form of either or both of descriptions of discrete events and accumulated statistics.

The simulated users 116 may be represented as particles and travel through the simulated transportation network according to particle simulation techniques. Geometrically, the simulator 104 may represent the simulated users 116 within simulation space (e.g., the simulated? transportation network 114) as points, circles, rectangles, spheres, or cuboids. The geometric representation for each of the simulated users 116 may be used to judge collisions between pairs of the simulated users 116, to judge collisions between the simulated users 116 and features of the simulated transportation network 116 (i.e., lane boundaries, roadway boundaries, of objects such as traffic barriers), to judge whether the simulated users 116 are located in an invalid position (i.e., outside the boundaries of the segments 218), and/or for other purposes. The simulated users 116 may each be associated with a movement model that describes how the simulated users 116 are able to move, including, as examples, acceleration, deceleration, and rotation (i.e., turning). The movement model may be, as examples, a kinematic vehicle model or a dynamic vehicle model.

The simulated users 116 may be separately controlled. For example, in an object-oriented approach, each of the simulated users may be an object that includes control instructions (e.g., computer program instructions) that are used to move the simulated users during execution of the simulation by the simulator 104. The control instructions may be used to control any or all of navigation, trajectory, acceleration, turning and/or other aspects of control of the motion of the simulated users 116 at each time step of the simulation. In one implementation, the control instructions for the simulated users 116 include a set of rules that are used to make control decisions for the simulated users. In another implementation, the control instructions include one or more trained machine learning models, implemented, for example, using a deep neural network and/or reinforcement learning techniques.

In other implementations, a common control scheme can be applied to all of the simulated users 116 by the simulator 104. For example, for each of the simulated users 116, the simulator 104 may apply a single rules-based control scheme to each of the simulated users 116.

The simulated users 116 may be controlled, separately or commonly, using information associated with the simulated transportation network 114. For example, each of the segments 218 of the map 102 that is represented in the simulated transportation network 114 can expose information to the simulated users 116 for use in control decisions when the simulated users are located in or near that portion of the simulated transportation network 114. As one example, the attributes 220, the states 222, the actions 224, and the rules 226 can be made available to the simulated users 116 for use in making control decisions. As another example, locations of other ones of the simulated users 116 within a specified area around the respective one of the simulated users 116 that is being controlled can be made available for use in control decisions.

Figure 3:
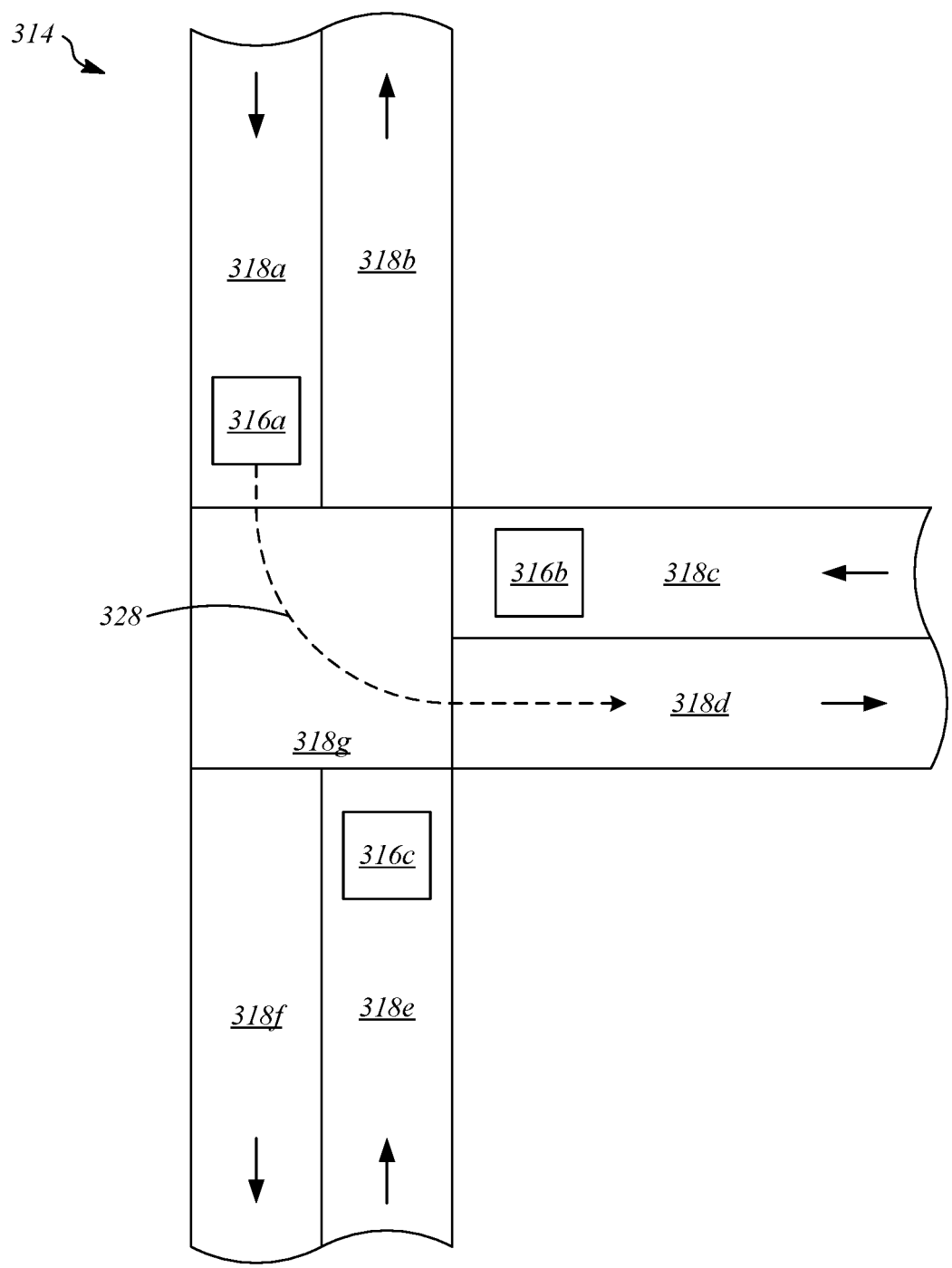
FIG. 3 is an illustration that shows a portion of a simulated transportation network and a group of simulated users.

The simulated transportation network 114 and the simulated users 116 will be further described with respect to FIG. 3, which is an illustration that shows a transportation network portion 314 of the simulated transportation network 114 and a group of the simulated users 116, including first through third simulated users 316a-316c. The transportation network portion 314 includes network segments 318a-318g. Each of the network segments 318a-318g corresponds to a respective one of the segments 218 of the map 102, and is based on and uses the attributes 220, states 222, and actions 224 for the respective one of the segments 218.

The geometric configurations, relative positions, and connectivity for the network segments 318a-318g are described by the attributes 220 for the corresponding ones of the segments 218 of the map 102. In the illustrated example, the network segments 318a-318f represent lane segments, and the network segment 318g represents an intersection, which may include additional segments that represent connectivity of the lane segments. The network segment 318g may be associated with information that indicates an intersection type, and the simulator 104 may model operation of the intersection according to the intersection type (e.g., stop-controlled, signalized), and according to information indicating operating parameters for the intersection, such as traffic signal phasing.

The network segments 318a, 318c, and 318e are each approaching the intersection represented by network segment 318g, and are associated with actions 224 for the respective ones of the segments 218 of the map 102 that specify that the simulated users 316a-316c must each stop before entering the intersection. The network segments 318a, 318c, and 318e may each also be associated with states 222 for the respective ones of the segments 218 of the map 102 that specify, for each of the network segments 318a, 318c, and 318e, whether users of that segment currently have right-of-way to enter the intersection at network segment 318g. In the illustrated example, the first simulated user 316a has right-of-way and is following a path 328 from the network segment 318a, through the intersection represented by network segment 318g, to the network segment 318d, which leads away from the network segment 318g.

With further reference to FIG. 1, the validation rules 106 are used by the simulator 104 to identify possible errors in the map 102. The validation rules 106 can specify, as examples, conditions that, when present, are indicative of an error in the map 102. The validation rules 106 may be associated with specific types of map errors or specific regulations that are applicable to the transportation network that is represented by the map 102 or a portion of the transportation network that is represented by the map 102. When the validation rules 106 are applied to the map 102 by the simulator 104 and an error is identified, the output may describe the validation rule 106 that identified the error, the type of error identified, and the nature of the simulation result 104 involved. For example, the result of processing one of the validation rules 106 could indicate that simulated users are colliding with or crossing out of a lane boundary or could indicate that collisions are occurring between pairs of the simulated users 116, in a manner that indicates that a map data error may be causing the abnormal result during the simulation 104.

As one example, one of the validation rules 106 may specify that a possible error is present if one of the simulated users 116 travels outside of lane and/or segment boundaries of the simulated transportation network 114. As another example, one of the validation rules 106 may specify that a possible error is present if two of the simulated users 116 collide. As another example, one of the validation rules 106 may specify that a possible error is present if an operating parameter for one of the simulated users 116 is outside of an acceptable range (e.g., velocity, acceleration, deceleration, etc.). As another example, one of the validation rules 106 may specify that a possible error is present if one of the simulated users 116 is unable to reach an intended destination from an origin point. As another example, one of the validation rules 106 may specify that a possible error is present if the simulation performed by the simulator 104 results in unexpected traffic congestion (e.g., travel time for traversing one or more segments in excess of an expected value for a number of simulated users 116 that exceeds a threshold value). As another example, one of the validation rules 106 may specify that a possible error is present if the simulation performed by the simulator 104 results in a number of collisions between the simulated users 116 at an intersection, which may be indicative of an error in the operational parameters for the intersection.

The visualization 108 is a graphical depiction of the simulated transportation network 114 and the simulated users 116. The visualization 108 may be output for display to a user of the simulator 104 in a form that allows the user to observe movement and behaviors of the simulated users 116 relative to the simulated transportation network 114. For example, a graphical representation of the simulated transportation network 114 may be output in a format similar to that of a map, and the locations of the simulated users 116 can be out using symbols, icons, or other graphical representations. In some implementations, the visualization 108 can be provided with conditions that cause visual indicators to be output for display when the conditions indicate a map error (e.g., the condition is not satisfied). As an example, a graphical indicator can be output for display based on one of the validation rules 106, where the graphical indicator shows a location where a condition set by one of the validation rules 106 indicates a map error. Thus, as examples, graphical indicators can show locations where one or more of the simulated users 116 have left the lane segments of the simulated transportation network 114, where collisions have occurred between the simulated users 116, and where operating characteristics for the simulated users have deviated from expected ranges.

In some implementations, error reporting by the simulator 104 may be in the form of the reports 110. The reports 110 may be in the form of information that describes an error in the map 102. The reports 110 may include additional information, including information that describes circumstances under which the error was identified. In some implementations, the reports 110 are output in a human-readable format. In addition, or as an alternative, the reports 110 may be output in a machine-interpretable format. When in a machine-interpretable format, the reports 110 may be utilized for various purposes by various components. As one example, using the reports 110, the visualization 108 can be annotated to indicate a location of a map error. As another example, using the reports 110, an automated process can modify the map 102 to correct the map error, as will be explained with respect to the modification 112.

In some situations, when a condition specified by the validation rules 106 is identified a single time, a map error may be reported by the simulator 104 using the reports 110. In other situations, a number of occurrences in excess of a threshold or a rate of occurrences in excess of a threshold of a condition specified by the validation rules may cause reporting of a map error by the simulator 104 using the reports 110.

The modification 112 causes a change to the map 102 that corrects an error that was identified during a simulation performed by the simulator 104. By way of example, the modification 112 may be prepared in response to identification of a map error during the simulation by application of the validation rules 106 to the results of the simulation, either in real-time (i.e., during the simulation) or subsequent to completion of the simulation by analysis of information output by the simulator 104, such as the reports 110. As one example the validation rules 106 may identify a type of error, and specific types of map errors may be associated with procedures that are able to automatically correct map errors, such as by connecting discontinuities between lane segments. The modification may automatically modify an aspect of the map 102, with or without confirmation from a user. In some situations, detection of an error by the validation rules may not be associated with a particular type of map error, and additional analysis may be performed to determine the type of map error and to identify a procedure that is operable to modify the map 102 in a manner that corrects the map error.

Figure 4:
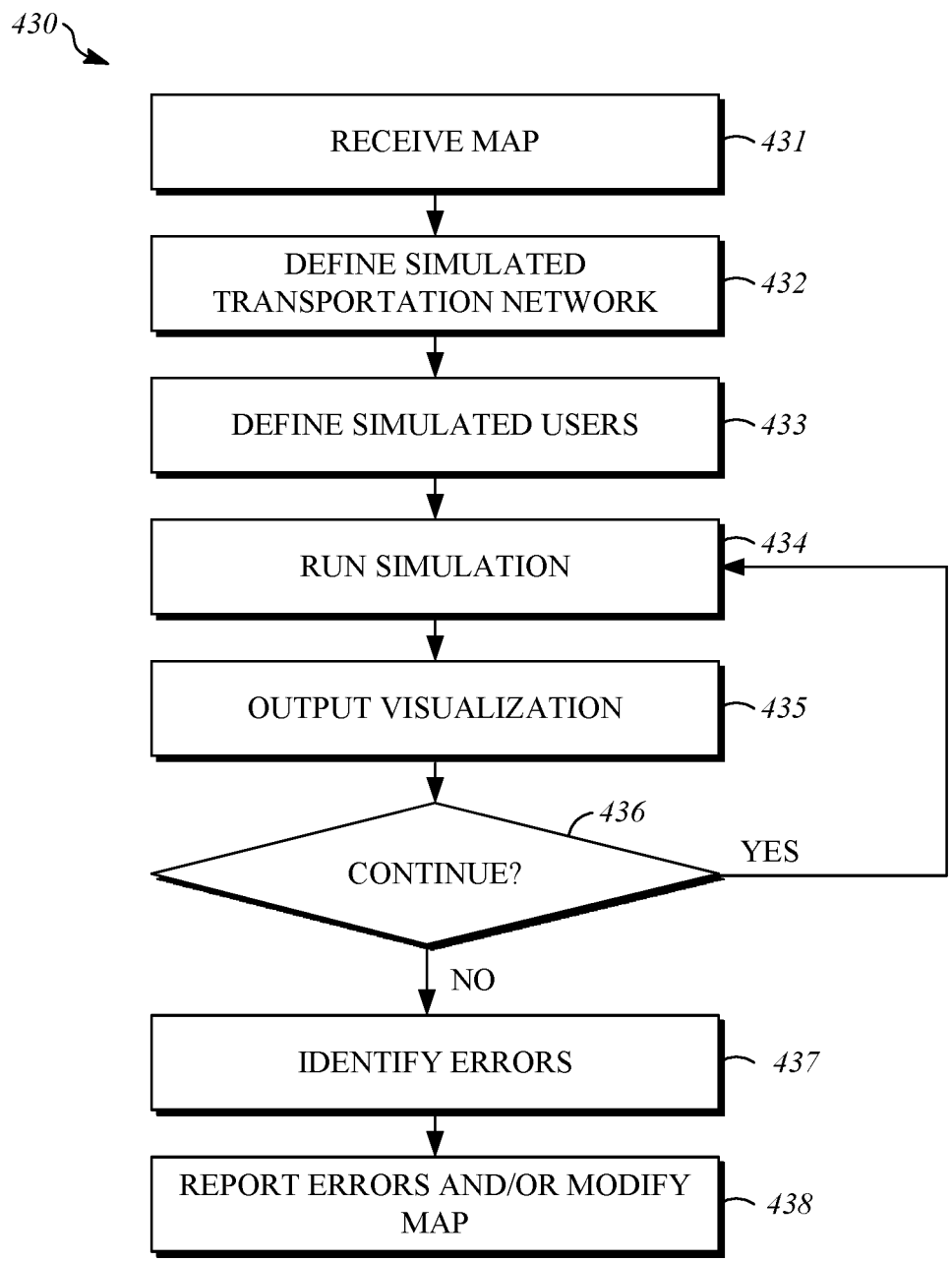
FIG. 4 is a flowchart that shows an example of a process for simulation-based map validation.

FIG. 4 is a flowchart that shows an example of a process 430 for simulation-based map validation. Operations of the process 430 can be caused, controlled, or performed by a computing device. The computing device may be provided with computer program instructions, that are stored in a storage device or a memory device, and a processor that is operable to execute the computer program instructions. When executed by the processor, the program instructions cause the computing device to perform the operations of the process 430 as described herein.

In operation 431, the map 102 is received as an input. Receiving the map 102 may include accessing the map 102 from a storage device, receiving the map 102 by a data transmission, receiving inputs from a human interface device that define map elements, or in any other suitable manner. The map 102 may be structured in any computer interpretable form, such as in the form described with respect to FIG. 2.

In operation 432, the simulated transportation network 114 is defined based on the map 102. The map 102 may represent a real-world physical transportation network, and therefore, the simulated transportation network 114 may be defined such that it represents a real-world physical transportation network.

The simulated transportation network 114 may include features that are representative of transportation facilities such as vehicle lanes, intersections, bicycle lanes, crosswalks, and sidewalks. The simulated transportation network 114 may be defined such that portions of the transportation network are defined using geometric and operational information from the map 102, such as the attributes 220, the states 222, the actions 224, and the rules 226, as previously described.

In operation 433, the simulated users 116 are defined. As one example, each of the simulated users 116 can be modeled as a particle. In some implementations, defining the simulated users 116 includes assigning control instructions that are used to decide how the simulated users 116 will move during the simulation. In some implementations, the simulated users are assigned an origin position, a destination position, and/or a navigation route to be followed during the simulation.

In operation 434, the simulator 104 simulates traversal of the simulated transportation network by one or more of the simulated users 116. The simulation may be advanced by one or more time steps in operation 434, and the size of the time steps may be set to any desired value.

In operation 434, each of the simulated users 116 can be moved with respect to the simulated transportation network 114 using control instructions. As examples, the control instructions may include control rules, or the control instructions include a trained machine learning model. Machine learning models utilized to implement the control instructions may include a deep neural network and/or use of reinforcement learning techniques. Motion models may be utilized to describe how the simulated users 116 move. For example, motion of the simulated users 116 that represent vehicles may be modeled using a dynamics model or a kinematics model.

Movement of the simulated users in operation 434 may be performed using information from the simulated transportation network 114 that represents the attributes 220, states 222, actions 224, and rules 226 from the segments 218 of the map 102 that is being modeled by the simulated transportation network 114. For example, operating characteristics for the segments 218 that correspond to current locations of the simulated users 116 can be utilized when determining how to move the simulated users 116.

In operation 435, the visualization 108 is output for display to the user. In this example, the visualization 108 is output in real-time to the user. Alternatively, the visualization may be output after the simulation has been completed, based on data representing states for the simulated transportation network 114 and the simulated users 116 at each of the time steps of the simulation. In some implementations, the validation rules 106 may be evaluated based on and during the simulation, and graphical indicators that represent map errors can be output as part of the visualization.

In operation 436, a decision is made regarding whether to continue the simulation, in which case the process 430 returns to operation 434, or to end the simulation, in which case the process 430 proceeds to operation 437. As one example, the simulation may be executed until a predetermined number of time steps have been completed. As another example, the simulation may be executed until a command is received from the user to end the simulation.

In operation 437, errors are identified based on the results of the simulation. As an example, map errors can be identified using the validation rules 106. Thus, for example, operation 437 may include evaluating a validation rule based on the simulation, and determining that a map error is present based on the validation rule, such as when a condition specified by the validation rule is satisfied, thereby indicating that a map error is present. As one example, evaluating the validation rule may include determining whether an operating characteristic for one of the simulated users is outside of an acceptable range. As another example, evaluating the validation rule may include determining whether a condition has been satisfied more than a threshold number of times. As another example, evaluating the validation rule may include determining whether one of the simulated users have left the simulated transportation network. As another example, evaluating the validation rule may include determining that a collision has occurred between two of the simulated users.

Operation 438 includes outputting results of the simulation such as by reporting map errors in the form of the reports 110 and/or modifying the map 102. In some implementations, modifying the map 102 is performed manually, and may be performed in response to and using the reports 110. The reports 110 may be generated based on evaluation of the validation rules 106, as explained with respect to operation 437 and the reports 110 may further include information that describes a modification to be made to the map 102. The results output in operation 438 may alternatively or additionally include the modifications 112, which can be applied automatically to the map 102 with or without confirmation from a user of the simulator 104. As one example, the map error identified in operation 437 may be associated with a procedure that automatically modifies an aspect of the map 102. As another example, the map error identified in operation 437 may be associated with a procedure that analyzes the map 102 to determine an error type and selects a procedure that automatically modifies an aspect of the map 102 based on the error type.

Figure 5:
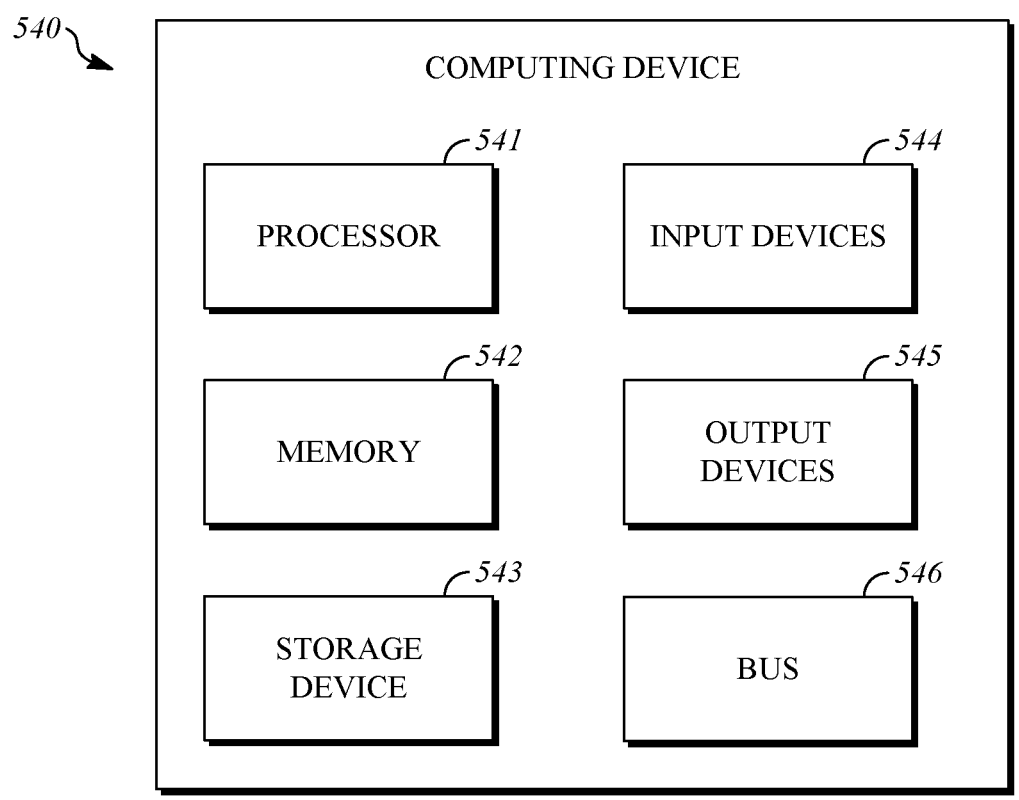
FIG. 5 is an illustration that shows an example of a configuration for a computing device that can be utilized to implement the simulator.

FIG. 5 is an illustration that shows an example of a configuration for a computing device 540 that can be utilized to implement the simulator 104. The computing device 540 can include a processor 541, a memory 542, a storage device 543, one or more input devices 544, and one or more output devices 545. The computing device 540 can include a bus 546 or a similar device to interconnect the components for communication. The processor 541 is operable to execute computer program instructions and perform operations described by the computer program instructions. As an example, the processor 541 can be a conventional device such as a central processing unit. The memory 542 can be a volatile, high-speed, short-term information storage device such as a random-access memory module. The storage device 543 can be a non-volatile information storage device such as a hard drive or a solid-state drive. The input devices 544 can include any type of human-machine interface such as buttons, switches, a keyboard, a mouse, a touchscreen input device, a gestural input device, or an audio input device. The output devices 545 can include any type of device operable to provide information to a user, such as a display screen or an audio output.

As described above, one aspect of the present technology is the gathering and use of data available from various sources to provide mapping and navigation services to users. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to create maps and navigation routes that are relevant to users. Further, other uses for personal information data that benefit the user are also contemplated by the present disclosure. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in mapping and navigations services, the present technology can be configured to allow users to select to "opt in" or "opt out" of participation in the collection of personal information data during registration for services or anytime thereafter. In another example, users can select not to provide personal information. In yet another example, users can select to limit the length of time personal information is maintained or entirely prohibit the storage of personal information. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, mapping and navigation services may be provided based on non-personal information data or a bare minimum amount of personal information, such as the content being requested by the device associated with a user, other non-personal information available to the mapping and navigation services, or publicly available information.

What is claimed is:

1. A method, comprising:
defining a simulated transportation network based on a map that represents a real-world physical transportation network, wherein the simulated transportation network includes segments, and each segment includes information that describes operating characteristics for the segment;
defining simulated users;
performing a simulation in which the simulated users are moved relative to the simulated transportation network, wherein the simulated users are moved using control instructions, and the simulated users are moved based on the information that describes operating characteristics for the segment that corresponds to a respective current location for each of the simulated users;
evaluating a validation rule based on a behavior of the simulated users in the simulation, wherein the validation rule specifies one or more conditions that are indicative of errors in the map;
identifying a map error in the map based on the evaluation of the validation rule, wherein the map error represents a feature of the map that does not accurately represent a real-world feature; and
applying a modification to the map in response to the identification of the map error during the simulation.

2. The method of claim 1, wherein each of the simulated users is modeled as a particle.

3. The method of claim 1, wherein the control instructions include control rules.

4. The method of claim 1, wherein the control instructions include a trained machine learning model.

5. The method of claim 1, wherein at least some of the simulated users are moved using a vehicle dynamics model.

6. The method of claim 1, further comprising:
outputting information describing a result based on evaluation of the validation rule.

7. The method of claim 6, wherein the information describing a result based on evaluation of the validation rule includes the modification to be made to the map.

8. The method of claim 7, wherein the modification is automatically applied to the map.

9. The method of claim 1, wherein evaluating the validation rule includes determining whether an operating characteristic for one of the simulated users is outside of an acceptable range.

10. The method of claim 1, wherein evaluating the validation rule includes determining whether a condition has been satisfied more than a threshold number of times.

11. The method of claim 1, wherein evaluating the validation rule includes determining whether one of the simulated users has left the simulated transportation network.

12. The method of claim 1, wherein evaluating the validation rule includes determining that a collision has occurred between two of the simulated users.

13. The method of claim 1, further comprising:
outputting, for display, a visualization that is based on the simulation.

14. The method of claim 13, further comprising:
evaluating the validation rule based on the simulation, wherein the visualization includes a graphical indicator that represents the map error indicated by the validation rule.

15. A non-transitory computer-readable storage device including program instructions executable by one or more processors that, when executed, cause the one or more processors to perform operations, the operations comprising:
defining a simulated transportation network based on a map that represents a real-world physical transportation network, wherein the simulated transportation network includes segments, and each segment includes information that describes operating characteristics for the segment;
defining simulated users;
performing a simulation in which the simulated users are moved relative to the simulated transportation network, wherein the simulated users are moved using control instructions, and the simulated users are moved based on the information that describes operating characteristics for the segment that corresponds to a respective current location for each of the simulated users;
evaluating a validation rule based on a behavior of the simulated users in the simulation, wherein the validation rule specifies one or more conditions that are indicative of errors in the map;
identifying a map error in the map based on the evaluation of the validation rule, wherein the map error represents a feature of the map that does not accurately represent a real-world feature; and
applying a modification to the map in response to the identification of the map error during the simulation.

16. The non-transitory computer-readable storage device of claim 15, the operations further comprising:
outputting information describing a result based on evaluation of the validation rule.

17. The non-transitory computer-readable storage device of claim 15:
wherein each of the simulated users is modeled as a particle;
wherein at least some of the simulated users are moved using a vehicle dynamics model;
wherein the operations further comprise evaluating a validation rule based on the simulation, and outputting information describing a result based on evaluation of the validation rule;
wherein the information describing a result is based on evaluation of the validation rule includes the modification to be made to the map;
wherein the modification is automatically applied to the map;
wherein the operations further comprise outputting, for display, a visualization that is based on the simulation; and
evaluating the validation rule based on the simulation, wherein the visualization includes a graphical indicator that represents the map error indicated by the validation rule.

18. A system, comprising:
a memory; and
a processor configured to execute instructions stored in the memory to:
define a simulated transportation network based on a map that represents a real-world physical transportation network, wherein the simulated transportation network includes segments, and each segment includes information that describes operating characteristics for the segment,
define simulated users,
perform a simulation in which the simulated users are moved relative to the simulated transportation network, wherein the simulated users are moved using control instructions, and the simulated users are moved based on the information that describes operating characteristics for the segment that corresponds to a respective current location for each of the simulated users,
evaluate a validation rule based on a behavior of the simulated users in the simulation, wherein the validation rule specifies one or more conditions that are indicative of errors in the map, and
identify a map error in the map based on the evaluation of the validation rule wherein the map error represents a feature of the map that does not accurately represent a real-world feature, and
applying a modification to the map in response to the identification of the map error during the simulation.

19. The system of claim 18, wherein the processor is further configured to:
output information describing a result based on evaluation of the validation rule.

20. The system of claim 18:
wherein each of the simulated users is modeled as a particle;
wherein at least some of the simulated users are moved using a vehicle dynamics model;
wherein the processor is configured to execute further instructions stored in the memory to evaluate a validation rule based on the simulation, and output information describing a result based on evaluation of the validation rule;

wherein the information describing a result based on evaluation of the validation rule includes the modification to be made to the map;
wherein the modification is automatically applied to the map;
wherein the processor is configured to execute further instructions stored in the memory to output, for display, a visualization that is based on the simulation; and
evaluating the validation rule based on the simulation, wherein the visualization includes a graphical indicator that represents the map error indicated by the validation rule.

21. The system of claim 18, wherein the processor is configured to evaluate the validation rule by determining whether one of the simulated users has left the simulated transportation network.

* * * * *